United States Patent
Priel et al.

(10) Patent No.: US 9,431,338 B2
(45) Date of Patent: Aug. 30, 2016

(54) BYPASS CAPACITOR CIRCUIT AND METHOD OF PROVIDING A BYPASS CAPACITANCE FOR AN INTEGRATED CIRCUIT DIE

(75) Inventors: Michael Priel, Hertzelia (IL); Leonid Fleshel, Hertzelia (IL); Anton Rozen, Gedera (IL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 913 days.

(21) Appl. No.: 13/509,922

(22) PCT Filed: Nov. 30, 2009

(86) PCT No.: PCT/IB2009/055418
§ 371 (c)(1),
(2), (4) Date: May 15, 2012

(87) PCT Pub. No.: WO2011/064624
PCT Pub. Date: Jun. 3, 2011

(65) Prior Publication Data
US 2012/0236630 A1    Sep. 20, 2012

(51) Int. Cl.
*G11C 11/24*       (2006.01)
*H01L 23/522*      (2006.01)
(Continued)

(52) U.S. Cl.
CPC ........... *H01L 23/5223* (2013.01); *H01L 22/22* (2013.01); *H01L 23/5286* (2013.01); *H01L 23/585* (2013.01); *G11C 2029/5002* (2013.01); *H01L 22/14* (2013.01); *H01L 23/49589* (2013.01); *H01L 2924/0002* (2013.01)

(58) Field of Classification Search
CPC ............... H01L 28/40; H01L 23/5223; H01L 27/0629; H01L 23/642; H01L 2924/3011; H01L 2924/15153; H01L 23/49589; H01L 2924/19041; H01L 27/0805; G11C 29/02; G11C 11/4074; G11C 5/147
USPC .............. 365/149, 189.09, 51; 257/532, 686, 257/777, E21.008, E27.084
See application file for complete search history.

(56) References Cited

U.S. PATENT DOCUMENTS 5,329,237 A    7/1994   Horch
5,841,184 A *  11/1998  Li ........................ H01L 23/642
                                                  257/277

(Continued)

OTHER PUBLICATIONS

International Search Report and Written Opinion correlating to PCT/IB2009/055418 dated Aug. 2, 2010.

*Primary Examiner* — David Lam

(57) ABSTRACT

A bypass capacitor circuit for an integrated circuit (IC) comprises one or more capacitive devices, each arranged in a segment of a seal ring area of a die, which comprises the IC. A method of providing a bypass capacitance for an IC comprises providing a semiconductor wafer device comprising a plurality of dies, each comprising an IC; arranging one or more capacitive devices in a seal ring area of at least one of the IC; dicing the semiconductor wafer device; in a test mode, for each of the one or more capacitive devices, enabling the capacitive device, determining an operability parameter value indicative of an operability of the capacitive device, and storing the operability parameter in a memory device; and in a normal operation mode, providing a bypass capacitance to the IC depending on a capacitance of one or more of the capacitive devices having an associated operability parameter value indicative of a non-defectiveness of the corresponding capacitive device.

20 Claims, 3 Drawing Sheets

(51) Int. Cl.
 *H01L 23/528* (2006.01)
 *H01L 23/58* (2006.01)
 *H01L 23/495* (2006.01)
 *G11C 29/50* (2006.01)
 *H01L 21/66* (2006.01)

(56) References Cited

U.S. PATENT DOCUMENTS

| | | | |
|---|---|---|---|
| 5,917,762 A * | 6/1999 | Zheng | G11C 7/1072 327/261 |
| 6,591,406 B2 | 7/2003 | Ishikawa | |
| 6,907,658 B2 | 6/2005 | Li | |
| 7,268,632 B2 * | 9/2007 | Bonaccio | H03L 7/093 327/157 |
| 7,339,388 B2 | 3/2008 | Aghababazadeh et al. | |
| 7,557,425 B2 * | 7/2009 | Sundstrom | 257/532 |
| 7,557,430 B2 | 7/2009 | Barber et al. | |
| 7,563,694 B2 | 7/2009 | Burnside et al. | |
| 7,728,423 B2 | 6/2010 | Naito | |
| 7,820,520 B2 * | 10/2010 | Demircan | H01L 23/5223 257/E21.014 |
| 8,278,737 B2 * | 10/2012 | Chen | H01L 21/78 257/618 |
| 2008/0185685 A1 | 8/2008 | Nakashiba | |
| 2008/0230873 A1 | 9/2008 | Demircan et al. | |
| 2009/0040857 A1 | 2/2009 | McNeil et al. | |
| 2009/0121322 A1 | 5/2009 | Ozawa | |

\* cited by examiner

BYPASS CAPACITOR CIRCUIT AND METHOD OF PROVIDING A BYPASS CAPACITANCE FOR AN INTEGRATED CIRCUIT DIE

FIELD OF THE INVENTION

This invention in general relates to integrated circuits and more specifically to a bypass capacitor circuit for an integrated circuit, an integrated circuit die and a method of providing a bypass capacitance for an integrated circuit.

BACKGROUND OF THE INVENTION

Many integrated circuits, especially if arranged to work at high frequencies, use bypass capacitances for attenuation of unwanted frequency components. This capacitance can be provided for example within the integrated circuit itself, while increasing the required die area and accordingly costs of the integrated circuit. A different approach may include provision of external capacitors off-chip, e.g, in the package, that is not integrated on the same die, providing separate devices to be connected to the IC. However, this increases the overall footprint of the package and requires additional operations.

SUMMARY OF THE INVENTION

The present invention provides a bypass capacitor circuit for an integrated circuit, an integrated circuit die and a method of providing a bypass capacitance for an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
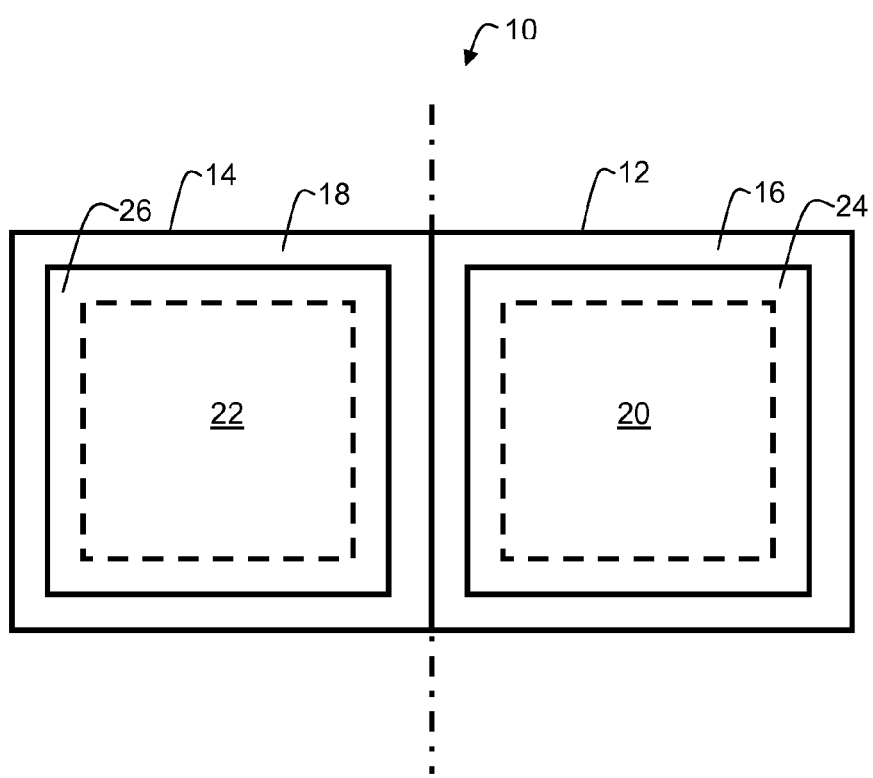
FIG. 1 schematically shows examples of two integrated circuit dies of a wafer, each with a seal ring area.

Referring to FIG. 1, a schematic block diagram is provided showing two integrated circuit dies 12, 14 of a wafer 10. An integrated circuit 20, 22 may be provided with each die 12, 14. An integrated circuit die may comprise a bypass capacitor circuit as described below. In the shown example, each of the integrated circuits 20, 22 may comprise an input/output interface and may therefore comprise a circumferential area adjacent to the peripheral area of the IC, in this example a ring area 24, 26 for input/output (IO) which encloses the IC areas 20, 22. The shown interfaces may for example be high frequency IO interfaces requiring a bypass capacitance for robust implementation.

After IC fabrication, the wafer may be diced, that is the dies with the integrated circuits are separated from each other. As shown, a scribe line is provided the two adjacent dies so that these dies can be separated by cutting the semiconductor wafer 10 along the scribe line. It will be apparent that additional scribe lines may be provided when the wafer includes more dies, e.g. which define a matrix of dies.

The dies 12, 14 each comprise a seal ring area 16, 18. The seal ring area 16, 18 is provided between the scribe line(s) and the respective peripheral regions of the internal circuit. In this example the seal ring area 16, 18 is a perimeter at the edge of each die. The perimeter extends in the plane of the wafer surface, around the integrated circuit of the respective die and separates the ring areas 24, 26 from the scribe line. The ring areas 24, 26 in turn separate the peripheral regions from the seal ring area 16, 18. The seal ring areas 16, 18 serve to protect the integrated circuit 20, 22 and components peripheral thereto, e.g. in this example the components in the ring area 24, 26 during dicing. Wafer dicing may damage the die areas close to their edges. Thus, the seal ring area, situated on the wafer between the integrated circuits of different dies in the area where the wafer is to be diced, is not occupied by the integrated circuit or peripheral components thereof and thus any damage in the seal ring area will not affect the performance of the integrated circuit.

Figure 2:
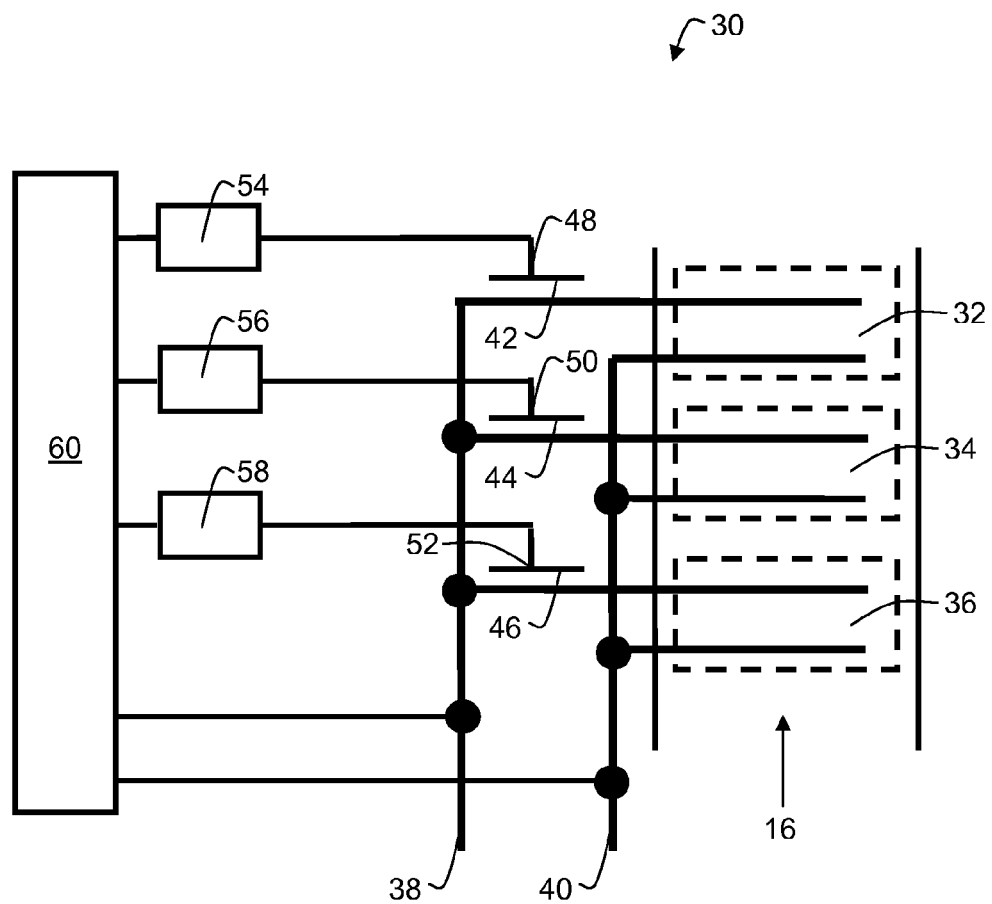
FIG. 2 schematically shows an example of an embodiment of a bypass capacitor circuit.

Referring now also to FIG. 2, an example of an embodiment of a bypass capacitor circuit 30 for an integrated circuit 20 is shown. The bypass capacitor circuit 30 may comprise one or more capacitive devices 32, 34, 36, each arranged in a segment of a seal ring area 16 of a die 12, the die 12 comprising the integrated circuit. Since the capacitors are provided in the sea ring area 16 the need for enlarging the die area used for the integrated circuit 20 itself may be avoided or reduced. The seal ring area 16, which may otherwise remain unused due to the probability of defects for example caused by cutting the wafer 10 into dies 12, 14, may remain connected to the integrated circuit even after dies 12, 14 of wafer 10 have been separated. The capacitive devices 32, 34, 36 may be implemented on-chip, that is on the same die 12 as the integrated circuit. The shown approach may thus avoid or at least reduce a need for off-chip provision of bypass capacitances. It will be apparent that, in addition to the bypass capacitor circuit 30, bypass capacitor circuits in the integrated circuits or off-chip bypass capacitor circuits may be provided.

The available size of the seal ring, that is the distance between the integrated circuit 20 and the nearest edge of the die 12 may depend on the fabrication process. The size may for example be about 50 μm. However, it may be smaller or larger. The seal ring may comprise one large segment or may be divided into a plurality of segments, for example hundreds, e.g. 300 or 400 segments, each segment comprising a capacitive device 32, 34, 36, hence making use of a great part or all of the seal ring area 16 of the die 12. A selection of a suitable number of segments may depend on parameters of the fabrication process or the substrate. Since there may be a non-zero probability of having damaged seal ring regions, a number of segments having capacitive devices may be chosen as high as possible, each capacitive device with low capacitance. This may result in an overall bypass capacitance close to a maximum available capacitance of undamaged capacitive devices 32, 34, 36. A less damaging wafer dicing process may result in less seal ring regions damaged and may allow for usage of fewer segments, each with a capacitive device having a higher capacitance. Any damaged region may result in a smaller overall available bypass capacitance but may allow for less power consumption caused by connecting lines and additional devices used for configuring the bypass capacitor circuit.

As shown in FIG. 2, one or more of the capacitive devices 32, 34, 36 are connected to a power supply bus 38, 40, each through an associated switch 42, 44, 46. For example, supply line 38 may be connected to a reference potential such as ground and supply line 40 may be connected to voltage supply $V_{CC}$ of the integrated circuit 20. A switch may allow for connecting or disconnecting a particular capacitive device 32, 34, 36 to the supply bus, therefore changing the overall provided bypass capacitance or disconnecting defective capacitive devices.

A switch may for example be a transistor device such as a metal oxide semiconductor (MOS) transistor. However, other devices capable of coupling and decoupling a capacitive device to or from the bypass capacitor circuit may be used.

Each of the associated switches 42, 44, 46 may be arranged to disconnect the capacitive device 32, 34, 36 from the power supply bus 38, 40 when a value of an operability parameter of the capacitive device 32, 34, 36 is indicative of a defectiveness of the capacitive device. An operability parameter value may be any information indicative of the ability of the particular capacitive device 32, 34, 36 to function correctly. The operability parameter value may be a measured value of an electrical characteristic related to the capacitive device such as voltage or current, for example indicating a short circuit. The operability parameter indicative of defectiveness or normal operability of a particular capacitive device may for example be determined in a test mode by applying test values to the bypass capacitor circuit. Instead of electrical characteristics other operability information may be used, such as for example automatic visual inspection information.

One or more associated switches 42, 44, 46 may comprise a control input 48, 50, 52, each connected to a corresponding memory device 54, 56, 58, the memory device arranged to store a state of the associated switch. Depending on the state of the switch 42, 44, 46, the particular capacitive device 32, 34, 36 may or may not be connected to the bypass capacitor circuit. The state of the switch may depend on the corresponding operability parameter value, allowing for disconnecting defective capacitive devices. Or it may for example depend on a target overall bypass capacitance.

In an embodiment of the bypass capacitor circuit 30 the memory device 54, 56, 58 may be a permanent memory device. A permanent memory device may be any memory device configured to preserve a stored value such as an operability parameter value without a need for frequent refresh or during periods without power supply available. This may for example enable the bypass capacitor circuit 30 to be configured during a test phase, wherein defective capacitive devices, for example damaged during wafer dicing, may be detected and permanently disabled. This may allow providing an operable bypass capacitor circuit 30 for the integrated circuit 20 during normal operation without any need for further test or configuration. The bypass capacitor circuit can be located in the seal ring area 16 of the die 12, hence saving die area. The test phase may for example be performed during manufacturing prior to product delivery to a customer.

Any device capable of permanently memorizing a state may be used. For example, the memory device may be a fuse. Defective segments and capacitive devices may be permanently excluded from the bypass capacitor circuit by burning fuses. Other permanent memory devices may be used. Permanent memory devices may also comprise any nonvolatile memory storage media including semiconductor-based memory units such as FLASH memory, EEPROM, EPROM, ROM, ferromagnetic digital memories or MRAM.

In order to control the bypass capacitor circuit for example during testing and configuration, the bypass capacitor circuit 30 may comprise a controlling unit 60 connected to the one or more switches 42, 44, 46 and adapted to control a state of the one or more switches. The controlling unit 60 may perform testing of all connected capacitive devices 32, 34, 36, may determine operability parameter values and may switch on or off a particular capacitive device depending on a corresponding operability parameter value. In an embodiment where memory devices 44, 46, 48 are used, the controlling unit may be configured to write operability parameter values into corresponding memory devices. The controlling unit 60 may for example be placed on the integrated circuit die. In another embodiment, the controlling unit 60 may be placed off-chip and connected to the bypass capacitor circuit for example only during a test phase. This may save die area and avoid delivery of the controlling unit with the final product having a pre-configured bypass capacitor circuit.

Bypass capacitor circuits 30 may be used with many different applications. For example, any logic circuitry, especially when operating at high processing speed, may be sensitive for unwanted high-frequency components in the supply voltage which may cause erroneous behaviour of the logic circuitry. Also interfaces dedicated to high-speed data transmission to and from the IC may use a bypass capacitor circuit 30 for robust design. In an embodiment of the circuit and as indicated in FIG. 1, the integrated circuit 20 may comprise an input/output interface circuit. An input/output interface may enable bi-directional signal transmission to and from the integrated circuit. It should be noted that it is also in the scope of the described system that the interface may be a unidirectional interface either for data input or output.

The bypass capacitor circuit as presented may for example be used when the described input/output interface circuit may be arranged to connect to an external unit using one or more bondwires. Wirebonding is a technology of making interconnections between an IC and for example a printed circuit board (PCB) or to other IC or other electronic circuits. When wirebonding is applied, it may be impossible or at least difficult to place bypass capacitors for the interface circuit over die. In any case, bypass capacitors implemented separately from the die may result in increased costs and connections may potentially cause erroneous behavior.

Any integrated circuit device, especially when operating at high processing frequencies may benefit from a bypass capacitor reducing unwanted frequency components. The integrated circuit 20 protected by the bypass capacitor circuit 30 may for example be a very large scale integrated (VLSI) circuit. Very-large-scale integration (VLSI) is the process of creating integrated circuits by combining thousands of transistor-based circuits into a single chip. Here, VLSI may refer to any IC having thousands or even millions or billions of transistor-based circuits. Any other naming, such as for example ULSI (ultra large scale integration) suggesting a device to comprise more transistor-based circuits than a VLSI device may be considered a sub-group and comprised in VLSI. Therefore, for example any ULSI device is a VLSI device.

The integrated circuit device may be a data processing device. Processing devices operate at high frequencies and are sensitive to disturbances caused by noisy signals and supply voltages. The data processing device may for example be a processor, a general purpose processor (GPP), a microcontroller unit (MCU), a central cprocessing unit (CPU), a graphics processing unit (GPU) or a digital signal processor (DSP). It may be a single core or a multi core processing device.

Figure 3:
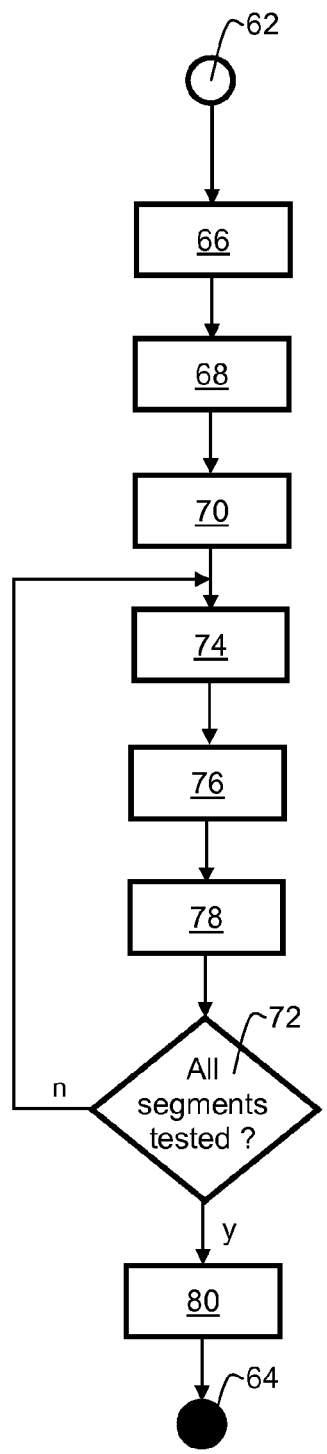
FIG. 3 schematically shows a flow diagram of an example of an embodiment of a method of providing a bypass capacitance for an integrated circuit.

Referring now to FIG. 3, a schematic flow diagram of an example of an embodiment of a method of providing a bypass capacitance for an integrated circuit is shown. The illustrated method allows implementing the advantages and characteristics of the described bypass capacitor circuit as part of a method of providing a bypass capacitance for an integrated circuit.

The flow diagram comprises a start 62 and an end 64 state. The method may comprise providing 66 a semiconductor wafer device comprising a plurality of dies, each comprising an integrated circuit; arranging 68 one or more capacitive devices in a seal ring area of at least one of the integrated circuits; dicing 70 the semiconductor wafer device; in a test phase, for each 72 of the one or more capacitive devices, enabling 74 the capacitive device, determining 76 an operability parameter value indicative of an operability of the capacitive device, and storing 78 the operability parameter in a memory device; and in a normal operation phase, providing 80 a bypass capacitance to the integrated circuit depending on a capacitance of one or more of the capacitive devices having an associated operability parameter value indicative of a non-defectiveness of the corresponding capacitive device. It will be apparent that not all the stages need to be performed at the same time and the same location. For example the provision 66 of the semiconductor wafer device and arranging 68 of the capacitive devices may be performed at one location, then the processing of the thus obtained intermediate product may be paused, and the intermediate product for example shipped to another location to be diced. After dicing, the intermediate product may for example shipped further to a location where the integrated circuits are tested and the test phase is performed.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate of the wafer 10 described herein can be any semiconductor material or combinations of materials, such as gallium arsenide, silicon germanium, silicon-on-insulator (SOI), silicon, monocrystalline silicon, the like, and combinations of the above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the capacitive device 32, 34, 36 may be further divided into more capacitive devices or merged into fewer devices. The memory devices 54, 56, 58 are shown as separate devices. However, they may also be implemented as a single memory device.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the controlling unit 60 may be implemented on the integrated circuit die 12. Alternatively, the examples may be implemented as any number of separate integrated circuits or separate devices interconnected with each other in a suitable manner. For example, the controller unit 60 may be a separate device only connected to the integrated circuit die for testing and permanently configuring the bypass capacitor circuit.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. An integrated circuit die, comprising:
    an integrated circuit within an interior region of the integrated circuit die; and
    a bypass capacitor circuit, including one or more capacitive devices, each arranged in a segment of a seal ring area of the integrated circuit die, the seal ring area at a peripheral region of the integrated circuit die, each of the one or more capacitive devices are connected to a power supply bus, each through a respective switch.

2. The integrated circuit die as claimed in claim 1 wherein each of said associated switches is arranged to disconnect said capacitive device from said power supply bus when a value of an operability parameter of said capacitive device is indicative of a defectiveness of said capacitive device.

3. The integrated circuit die as claimed in claim 2 wherein one or more associated switches comprise a control input, each connected to a corresponding memory device, said memory device arranged to store a state of said associated switch.

4. The integrated circuit die as claimed in claim 2 comprising a controlling unit connected to said one or more switches and adapted to control a state of said one or more switches.

5. The integrated circuit die as claimed in claim 1 wherein one or more associated switches comprise a control input, each connected to a corresponding memory device, said memory device arranged to store a state of said associated switch.

6. The integrated circuit die as claimed in claim 5 wherein said memory device is a permanent memory device.

7. The integrated circuit die as claimed in claim 6 wherein said memory device is a fuse.

8. The integrated circuit die as claimed in claim 6 comprising a controlling unit connected to said one or more switches and adapted to control a state of said one or more switches.

9. The integrated circuit die as claimed in claim 5 comprising a controlling unit connected to said one or more switches and adapted to control a state of said one or more switches.

10. The integrated circuit die as claimed in claim 1 comprising a controlling unit connected to said one or more switches and adapted to control a state of said one or more switches.

11. The integrated circuit die as claimed in claim 1 wherein said integrated circuit comprises an input/output (IO) interface circuit.

12. The integrated circuit die as claimed in claim 11 wherein said IO interface circuit is arranged to connect to an external unit using one or more bond wires.

13. The integrated circuit die as claimed in claim 1 wherein said integrated circuit is a very large scale integrated circuit.

14. The integrated circuit die as claimed in claim 1 wherein said integrated circuit is a processing device.

15. The integrated circuit die as claimed in claim 1, further comprising:
    an input/output (IO) ring area defining the interior region of the integrated circuit, and defining an outer ring region between the IO ring area and an edge of the integrated circuit die.

16. A method of providing a bypass capacitance for an integrated circuit, comprising:
    providing a semiconductor wafer comprising at least two integrated circuit dice on which a respective integrated circuit having an interior region is situated; and
    fabricating a bypass capacitor circuit including one or more capacitive devices in a segment of a seal ring area of at least one of said integrated circuit dice, wherein the seal ring area at a peripheral region of the at least one of the integrated circuit dice.

17. The method as claimed in claim 16, wherein the at least one of the integrated circuit dice includes an input/output (IO) ring area enclosing the interior region of the respective integrated circuit, and defining an outer ring region between the IO ring area and an edge of the at least one of the integrated circuit dice.

18. The method of providing a bypass capacitance for an integrated circuit as claimed in claim 16, wherein the one or more capacitive devices are connected to a power supply bus, each through a respective switch.

19. A method of operating an integrated circuit of an integrated circuit die including a bypass capacitor circuit including one or more capacitive devices, each arranged in a segment of a seal ring area of the integrated circuit die, said integrated circuit die comprising said integrated circuit having an interior region, the method comprising:
    in a normal operation mode, providing a bypass capacitance to said integrated circuit depending on a capacitance of one or more of said capacitive devices having an associated operability parameter value indicative of a non-defectiveness of said corresponding capacitive device.

20. The method as claimed in claim 19, wherein the integrated circuit die includes an input/output (IO) ring area enclosing the interior region of the integrated circuit, and defining an outer ring region between the IO ring area and an edge of the integrated circuit die.

* * * * *